United States Patent [19]
Igarashi et al.

[11] Patent Number: 6,037,630
[45] Date of Patent: Mar. 14, 2000

[54] SEMICONDUCTOR DEVICE WITH GATE ELECTRODE PORTION AND METHOD OF MANUFACTURING THE SAME

[75] Inventors: Motoshige Igarashi; Hiroyuki Amishiro; Keiichi Higashitani, all of Hyogo, Japan

[73] Assignee: Mitsubishi Denki Kabushiki Kaisha, Tokyo, Japan

[21] Appl. No.: 08/976,076

[22] Filed: Nov. 21, 1997

[30] Foreign Application Priority Data

May 26, 1997 [JP] Japan ..................... 9-135055

[51] Int. Cl.$^7$ ................................. H01L 27/088
[52] U.S. Cl. .................. 257/336; 257/344; 257/408; 257/411; 257/413; 257/900; 257/412; 438/184; 438/204; 438/216; 438/231
[58] Field of Search ...................... 257/900, 408, 257/412, 413, 411, 384, 344, 336; 438/204, 216, 231, 184

[56] References Cited

U.S. PATENT DOCUMENTS

| | | | |
|---|---|---|---|
| 4,074,300 | 2/1978 | Sakai et al. | 357/23 |
| 4,128,670 | 12/1978 | Gaensslen | 427/86 |
| 4,907,048 | 3/1990 | Huang | 357/23.9 |
| 5,097,301 | 3/1992 | Sanchez | 357/23.3 |
| 5,162,884 | 11/1992 | Liou et al. | 257/384 |
| 5,256,894 | 10/1993 | Shino | 257/388 |
| 5,424,570 | 6/1995 | Sardella et al. | 257/333 |
| 5,818,092 | 10/1998 | Bai et al. | 257/388 |
| 5,834,817 | 11/1998 | Satoh et al. | 257/387 |
| 5,841,173 | 11/1998 | Yamashita | 257/384 |

FOREIGN PATENT DOCUMENTS

| | | |
|---|---|---|
| 3-136277 | 6/1991 | Japan . |
| 6-151834 | 5/1994 | Japan . |

*Primary Examiner*—William Mintel
*Attorney, Agent, or Firm*—McDermott, Will & Emery

[57] ABSTRACT

A first polysilicon film which contains phosphorus as an impurity is formed on a semiconductor substrate. A second polysilicon film which is higher in phosphorus concentration than the first polysilicon film is formed on the first polysilicon film. The second polysilicon film is anisotropically etched to expose a surface of the first polysilicon film. Thermal oxidation is then performed. A surface of the first polysilicon film and a surface of the second polysilicon film are oxidized according to their respective oxidization rates depending on their respective phosphorus concentrations. Thus, a semiconductor device in which the size of the gate electrode can be readily controlled and damage to the semiconductor substrate or the like can be suppressed, is obtained.

15 Claims, 19 Drawing Sheets

6,037,630

SEMICONDUCTOR DEVICE WITH GATE ELECTRODE PORTION AND METHOD OF MANUFACTURING THE SAME

BACKGROUND OF THE INVENTION

1. Field of the Invention

The present invention relates to a semiconductor device and a method of manufacturing the same, and in particular to a semiconductor device having a semiconductor substrate with reduced damage a gate electrode with high dimensional controllability and a method of manufacturing the same.

2. Description of the Background Art

One example of a conventional method of manufacturing a semiconductor device will now be described with reference to the figures. Referring to FIG. 26, a gate oxide film 105 is formed on a semiconductor substrate 101 by thermal oxidation or the like. A polysilicon film 107 is formed on gate oxide film 105 by chemical vapor deposition (CVD) or the like. A photoresist pattern 109 having a predetermined width is formed on polysilicon film 107.

Referring now to FIG. 27, photoresist pattern 109 is used as a mask to anisotropically etch polysilicon film 107. At the initial stage of the anisotropic etching, polysilicon film 107 remains on the entire surface of semiconductor substrate 101. Thus, the polysilicon film during plasma process is equipotential at all portions.

As the anisotropic etching proceeds, however, the polysilicon film remains in the shape of a mesa on semiconductor substrate 101. The remaining polysilicon film is charged to the potential which is determined by the sheath between the plasma and semiconductor substrate 101. Thus, electrical stress is applied to gate oxide film 105 in accordance with the difference between the potential of the polysilicon film and the potential of the semiconductor substrate.

Referring now to FIG. 28, gate oxide film 105 can be damaged in over-etching particularly at the portion indicated by A in the figure. More specifically, referring to FIG. 29, gate oxide film 105 is damaged in the vicinity of the portion immediately under a side surface of a gate electrode 107a. Then, gate electrode 107a is used as a mask and ion-implantation is performed on semiconductor substrate 101 to form a pair of source/drain regions (not shown). An MOS transistor including a gate electrode and source/drain regions is thus formed. In an MOS transistor thus formed, threshold voltage varies and the breakdown voltage of the gate oxide film is decreased, resulting in deterioration of its reliability.

A method of manufacturing a semiconductor device disclosed in Japanese Patent Laying-Open No. 6-151834 will now be described as a first technique to solve such problems with reference to the Figures.

Referring first to FIG. 30, a gate oxide film 202 of approximately 80 Å is formed on a p-type silicon substrate 201 on which a first thin, polycrystalline silicon film 203 of approximately 200 Å is formed by low pressure CVD. It is then left in the atmosphere for one hour. Then, low pressure CVD is employed to form a second thin, polycrystalline silicon film 204 of approximately 3000 Å.

Present between the first thin, polycrystalline silicon film 203 and the second thin, polycrystalline silicon film 204 is native oxide 209 of approximately 10 Å which adheres while the first thin, polycrystalline silicon film 203 is left in the atmosphere.

Referring now to FIG. 31, photolithography is employed to selectively form a photoresist 208 at the portion at which a gate electrode is to be formed. In this state, reactive ion etching is performed to selectively remove that portion of the second thin, polycrystalline silicon film 204 which is not covered with photoresist 208.

After the second thin, polycrystalline silicon film 204 has been removed, native oxide film 209 will be etched. Consequently, the end point of etching in the reactive ion etching system is detected, and the first thin, polycrystalline silicon film 203 is exposed or native oxide film 209 partially remains on the surface.

Referring now to FIG. 32, a heat treatment is performed in dry $O_2$ ambient to completely alter that portion of the first thin, polycrystalline silicon film 203 which is not located immediately under the gate electrode into an oxide film 205. Arsenic ions 206 are ion-implanted to form an ion-implantation layer 207.

Referring now to FIG. 33, a heat treatment is performed in $N_2$ ambient to form a pair of n-type source/drain diffusion layers 207a and 207b. An MOS transistor is thus formed which includes an electrode having the first thin, polycrystalline silicon film 203 and the second thin, polycrystalline silicon film 204, and source/drain diffusion layers 207a and 207b.

In this manufacturing method, the first thin, polycrystalline silicon film 203 covers gate oxide film 202 on p-type silicon substrate 201 in forming a gate electrode by anisotropic etching. Thus, damaging from the anisotropic etching to gate oxide 202 is suppressed.

A method of manufacturing a gate electrode of a semiconductor device disclosed in Japanese Patent Laying-Open No. 3-136277 will now be described as a second technique to solve the aforementioned problems with reference to the Figures.

Referring first to FIG. 34, a gate oxide film 302 of approximately 150 Å is formed on a silicon substrate 301. Phosphorus doped, polycrystalline silicon of approximately 2000 Å is deposited as a material for a gate electrode on gate oxide film 302 to form a first polycrystalline silicon film 303. After native oxide 304 is formed on the upper surface of the first thin, polycrystalline silicon film 303, phosphorus doped, polycrystalline silicon of approximately 5000 Å is deposited to form a second polycrystalline silicon film 305.

Referring now to FIG. 35, photolithography for patterning a gate electrode is applied to the second polycrystalline silicon film 305 to anisotropically etch the second polycrystalline silicon 305 until native oxide 304 is exposed.

Native oxide 304 acts as a stopper layer for stopping the etching, and the second polycrystalline silicon film 305 other than the pattern of the gate electrode and a portion of native oxide 304 are removed.

Referring now to FIG. 36, an antioxidation film 306 of 3000 Å formed of silicon nitride film or the like are formed on the entire surface of the first and second polycrystalline silicon films 303 and 305.

Referring then to FIG. 37, antioxidation film 306 is anisotropically etched to leave antioxidation film 306 only on a side surface of the second polycrystalline silicon film 305.

Referring then to FIG. 38, the polycrystalline silicon is wet-oxidized (850° C., one hour) and a polycrystalline silicon oxide film 307 is formed in the entire region of the first polycrystalline silicon film 303 other than the electrode pattern. A polycrystalline silicon oxide film 308 is also formed in an upper portion of the second polycrystalline silicon film 305.

Polycrystalline silicon oxide film 307 extends inwards by a distance E from an edge located under the pattern of the gate electrode. Distance E is adjusted by changing the oxidation time of the wet oxidation.

Referring then to FIG. 39, anisotropic etching is performed to remove antioxidation film 306 on the side surface of the second polycrystalline silicon film 305, and polycrystalline silicon oxide film 307 other than the pattern of the gate electrode, and polycrystalline silicon oxide film 308 on the pattern of the gate electrode. A gate electrode 309 is thus formed.

For gate electrode 309 form according to the aforementioned manufacturing method, polycrystalline silicon oxide film 307 extending into the first polycrystalline silicon film 303 remains on gate oxide film 302 exactly under a side surface of the gate electrode. Thus, electric field concentration exactly under the side surface of the gate electrode is significantly relaxed, and damage from the electric field concentration to gate oxide film 302 is suppressed.

However, each of the conventional techniques has the problems described below.

For the first technique, the first thin, polycrystalline silicon film 203 and the second thin, polycrystalline silicon film 204 exposed in FIG. 31 is thermally oxidized in the step shown in FIG. 32. The amount of oxidation depends on oxidation time and thus the amount of the first thin, polycrystalline silicon film 204 oxidized is almost equal to that of the second thin, polycrystalline silicon film 205 oxidized. It is thus difficult to achieve further precise control of the dimensions of the gate electrode, such as change of effective gate length and the height of the gate electrode.

For the second technique, the second polycrystalline silicon film 305 and the exposed first polycrystalline silicon film 303 shown in FIG. 37 are oxidized in water vapor ambient in the step shown in FIG. 38. In this example also, as is with the first technique, further precise control of the dimension of the gate electrode, such as change in dimension E shown in FIG. 38 and the height of the gate electrode, is difficult to achieve.

In the first technique, the entire surface of oxide film 205 can further be anisotropically etched after the step shown in FIG. 33 to form a sidewall on both sides of the first and second thin, polycrystalline silicon films 203 and 204. In the second technique also, a silicon nitride film can be formed on silicon substrate 301 after the step shown in FIG. 39 to cover the second polycrystalline silicon film 305 and the silicon nitride film can be anisotropically etched to form a sidewall on both sides of the first and second polycrystalline silicon films 303 and 305.

In these examples, the anisotropic etching can damage p-type silicon substrate 201 or silicon substrate 301 in the vicinity of its surface, or the silicon substrate can be etched.

Thus, precise control of the dimensions of a gate electrode can be difficult to achieve and a semiconductor substrate can be damaged by anisotropic etching in forming a sidewall on the gate electrode in the conventional methods of manufacturing semiconductor devices.

SUMMARY OF THE INVENTION

One object of the present invention is to provide a semiconductor with a gate electrode having its dimensions readily and precisely controlled, and a method of manufacturing the same.

Another object of the present invention is to provide a semiconductor device in which damage to a semiconductor substrate is reduced, and a method of manufacturing the same.

A semiconductor device in a first aspect of the present invention at least includes a first conductive layer and a second conductive layer and has a gate electrode portion which substantially symmetric in lateral cross section. The first conductive layer is formed on a main surface of a semiconductor substrate, has a first width and contains an impurity of a first concentration. The second conductive layer is formed on the first conductive layer, has a second width and contains an impurity of a second concentration, the second width and concentration being different from the first width and concentration.

According to this configuration, the impurity concentration of the first conductive layer differs from that of the second conductive layer and thus the oxidation rate of the first conductive layer differs from that of the second conductive layer in forming the first and second conductive layers by thermal oxidation. Thus, the dimensions of the first and second conductive layers can be readily and independently controlled. After the oxidation film is removed, the second conductive layer is different in width from the first conductive layer and a gate electrode portion which is substantially symmetric in lateral cross section is obtained.

Preferably, the second concentration is higher than the first concentration, the gate electrode portion is formed on a semiconductor substrate with a gate insulating film interposed therebetween, and a pair of source/drain regions are formed within a main surface of the semiconductor substrate with the gate electrode portion interposed therebetween.

In this example, oxidation rate of the second conductive layer is higher when the first and second conductive layers are simultaneously oxidized. Thus, the width of the second conductive layer is narrower than that of the first conductive layer. Consequently, the gate electrode has a substantially symmetric, convex shape in lateral cross section. Furthermore, the gate electrode portion is used as a mask and a main surface of the semiconductor substrate is doped with impurity ions to obtain a pair of source/drain regions of LDD structure by performing ion implantation once.

Preferably, a sidewall insulating film is provided such that it is in contact with each of both side surfaces of at least the second conductive layer, and the level of the upper end of the sidewall insulating film is above that of the upper surface of the second conductive layer.

In this example, the both side surfaces of the second conductive layer are not oxidized and only the upper surface thereof is oxidized in forming the second conductive layer. Thus, while the width of the second conductive layer is maintained, the level of the upper surface of the second conductive layer is below the level of the upper end of the sidewall insulating film. This allows a semiconductor substrate with a gate electrode having a reduced height.

Preferably, a pair of source/drain regions are formed in a main surface of a semiconductor substrate with a gate electrode portion interposed therebetween, and a metal compound film is formed on an upper surface of the second conductive layer and on a surface of the pair of source/drain regions.

In this example, an MOS transistor is formed having a metal compound layer formed on a surface of a source/drain region and on an upper surface of the second conductive layer. Since the level of the upper end of the sidewall insulating film is above that of the upper surface of the second conductive layer, short-circuit is not readily caused between a metal compound layer formed on the surface of the source/drain region and a metal compound layer formed on the upper surface of the second conductive layer in forming the metal compound layer. A highly reliable semiconductor device is thus obtained.

Further preferably, a tunnel film is disposed between the first and second conductive layers.

In this example, the etching for forming the second conductive layer can be readily stopped when the tunnel film is exposed. That is, the end point of the etching can be readily detected. Furthermore, electrical connection between the first and second conductive layers does not fail.

A semiconductor device in a second aspect of the present invention includes a gate electrode portion and a pair of source/drain regions. The gate electrode portion is formed on a main surface of a semiconductor substrate. The paired source/drain regions are formed in a main surface of the semiconductor substrate with the gate electrode portion interposed therebetween. The gate electrode portion includes a conductive layer, a first insulating film and a second insulating film. The conductive layer is formed on a main surface of the semiconductor substrate with a gate insulating film interposed therebetween, and has a predetermined width. The first insulating film is formed on the semiconductor substrate to cover the conductive layer. The second insulating film is formed on that surface of the first insulating film which is in contact with both side surfaces of the conductive layer, and is different in etching characteristics from the first insulating film.

According to this configuration, an MOS transistor which has a gate electrode including first and second insulating films and a source/drain region, is obtained. The second insulating film is formed with the first insulating film covering a surface of the semiconductor substrate. This suppresses damage to the surface of the semiconductor substrate from anisotropic etching in forming the second insulating film.

A method of manufacturing a semiconductor device in a third aspect of the present invention includes the following steps: a first conductive layer containing an impurity of a first concentration is formed on a semiconductor substrate with a gate insulating film interposed therebetween. A second conductive layer containing an impurity of a second concentration differing from the first concentration is formed on the first conductive layer. A photoresist pattern having a predetermined width that is formed on the second conductive layer is used as a mask and the second conductive layer is anisotropically etched to expose a surface of the first conductive layer. Heat treatment is performed to form an oxide film at a surface of the second conductive layer and the exposed first conductive layer. The oxide film is removed. The first and second conductive layers from which the oxide film has been removed are used as a mask and an impurity of a predetermined conductivity is ion-injected into a main surface of the semiconductor substrate.

According to this method, the oxidation rate of the first conductive layer is different from that of the second conductive layer. Thus, the widths of the first and second conductive layers are independently controlled. When the oxide film is removed, the width of the second conductive layer differs from that of the first conductive layer. Thus, a semiconductor device is obtained including a layered structure of the first and second conductive layers that is substantially symmetrical in lateral cross section.

Preferably, the second concentration is higher than the first concentration in this method, and this method includes the step of injecting impurity ions of a predetermined conductivity into a main surface of the semiconductor substrate while the first and second conductive layers from which the oxide film has been removed is used as a mask.

In this example, the width of the second conductive layer is narrower than that of the first conductive layer when the oxide film is removed, resulting in a substantially symmetric, convex shape in lateral cross section. The first and second conductive layers can be used as a mask and ion-implantation are performed on a surface of the semiconductor substrate once to form a pair of source/drain regions of LDD structure.

The method preferably includes the step of forming a tunnel film between the step of forming the first conductive layer and the step of forming the second conductive layer.

In this example, the etching of the second conductive layer can be readily terminated when the tunnel film is exposed. That is, the end point of the etching can be readily detected. Furthermore, electrical connection between the first and second conductive layers does not fail.

More preferably, the method includes between the step of exposing a surface of the first conductive layer and the step of forming an oxide film the following steps of: forming an insulating film on the first conductive layer to cover the second conductive layer; and anisotropically etching the insulating film to form a sidewall insulating film on both side surfaces of the second conductive layer.

In this example, only the upper surface of the second conductive layer can be oxidized while the both side surfaces thereof are not oxidized. Thus, while the width of the second conductive layer is maintained, the level of the upper surface of the second conductive layer is below that of the upper end of the sidewall insulating film.

More preferably, the method includes after the step of injecting impurity ions the following steps of: forming a metal film on the semiconductor substrate to cover the second conductive layer and the sidewall insulating film; performing thermal treatment to form a metal compound layer on the metal film which is in contact with the semiconductor substrate or the second conductive layer; and removing the metal film except for the metal compound.

In this example, an MOS transistor is formed that has a metal compound layer formed on a surface of a source/drain region and on an upper surface of the second conductive layer. Since the level of the upper end of the sidewall insulating film is above the level of the upper surface of the second conductive layer, short circuit is not readily caused between the metal compound layer formed on the surface of the source/drain region and the metal compound layer formed on the upper surface of the second conductive layer in forming the metal compound layer.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

A method of manufacturing a semiconductor device according to a first embodiment of the present invention and a semiconductor device obtained thereby will now be described with reference to the figures.

Figure 1:
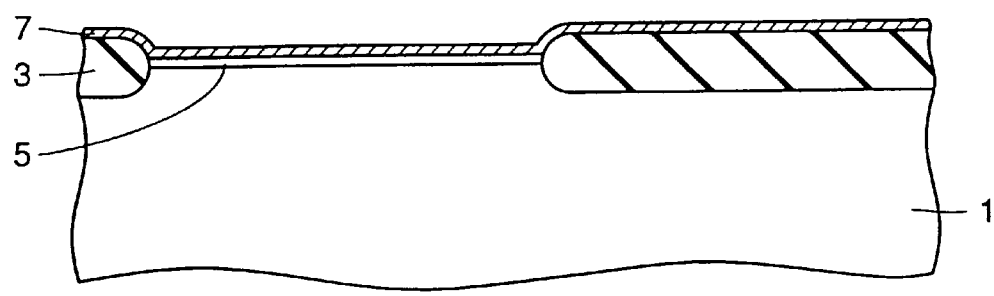
FIGS. 1–5 are cross sectional views illustrating a series of steps of a method of manufacturing a semiconductor device according to a first embodiment of the present invention.

Referring first to FIG. 1, an element isolating, oxide film 3 is formed in a predetermined region of a semiconductor substrate 1. A gate oxide film 5 is formed on semiconductor substrate 1 by thermal oxidation. Formed on gate oxide film 5 by chemical vapor deposition is a first polysilicon film 7 which contains phosphorus as an impurity. The concentration of the impurity is preferably in a range of $1\times10^{20}/cm^3$ to $1\times10^{21}/cm^3$.

Figure 2:
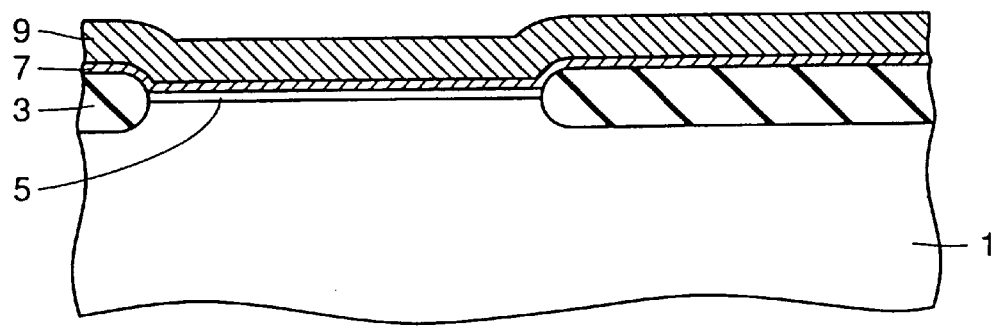

Referring now to FIG. 2, a second polysilicon film 9 containing phosphorus as an impurity is formed on the first polysilicon film 7 by chemical vapor deposition. Preferably, the concentration of the impurity is also in the aforementioned range and higher than the impurity concentration of the first polysilicon film 7.

Figure 3:
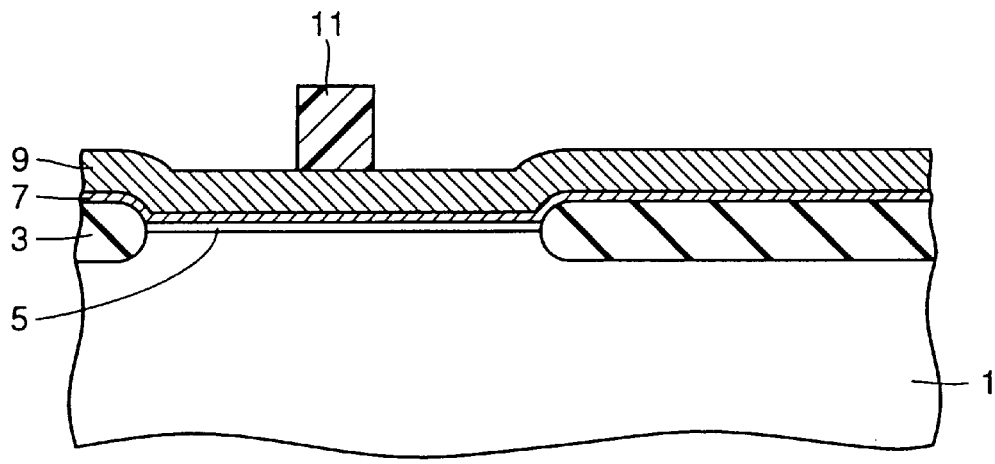

Referring then to FIG. 3, a photoresist pattern 11 having a predetermined width is formed on the second polysilicon film 9.

Figure 4:
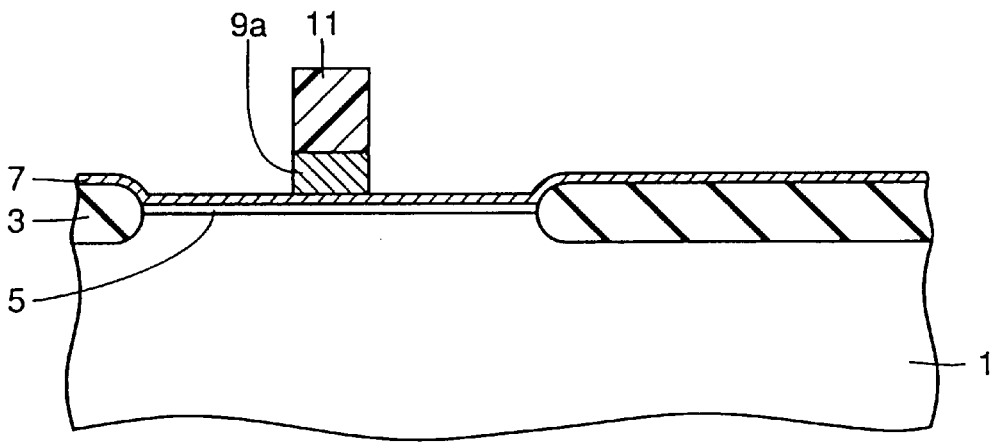

Referring then to FIG. 4, photoresist pattern 11 is used as a mask to anisotropically etch the second polysilicon film 9 so that a surface of the first polysilicon film 7 is exposed. An upper conductive layer 9a is thus formed.

Figure 5:
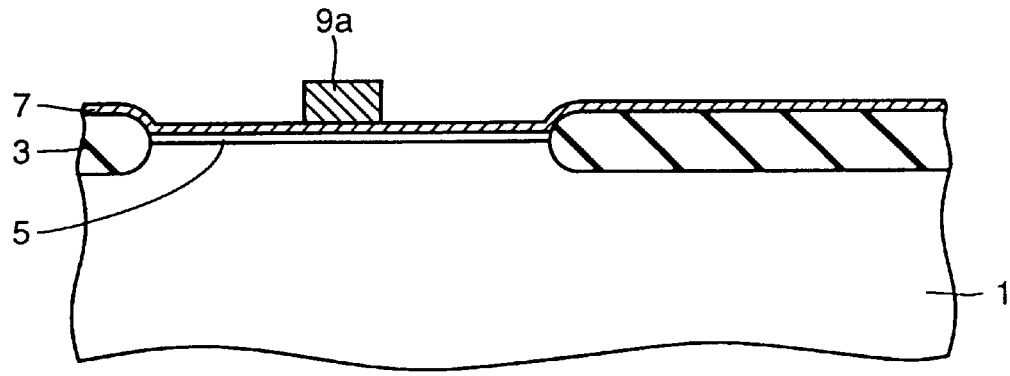
Figure 6:
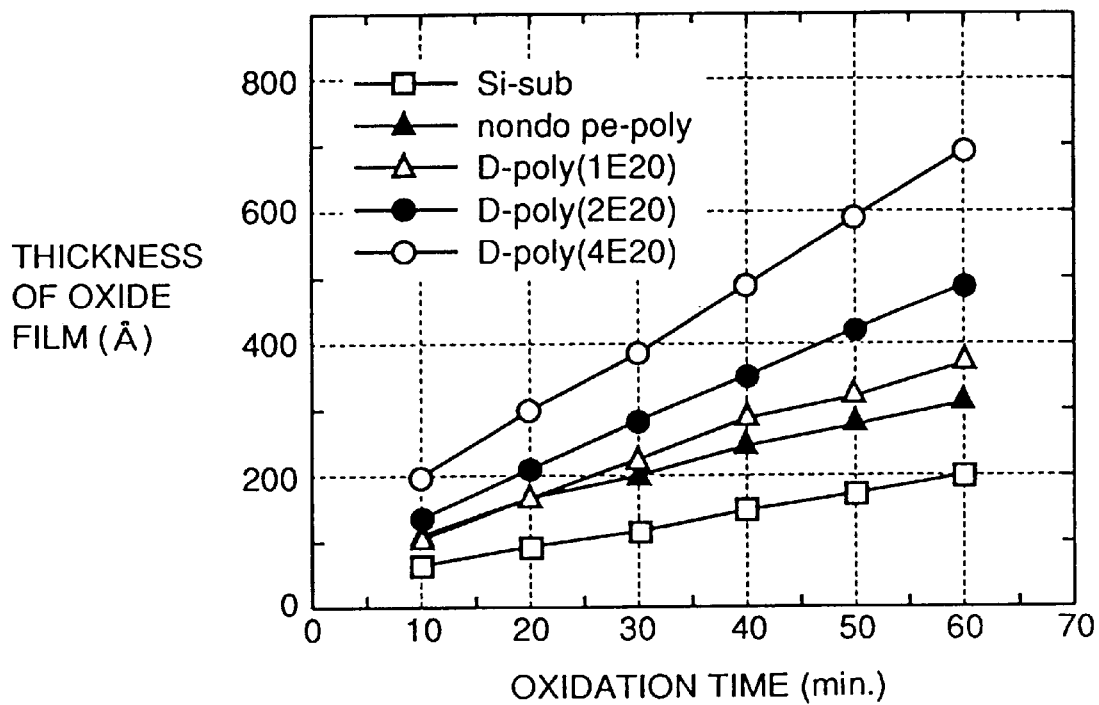
FIG. 6 is a graph representing dependence of thickness of oxide film on oxidation time in the first embodiment.

Referring now to FIG. 5, the photoresist pattern shown in FIG. 4 is removed. At a predetermined temperature and in a predetermined ambient, heat treatment is performed on the semiconductor substrate 1 to oxidize upper conductive layer 9a and the first polysilicon film 7. The thickness of the oxide film obtained will be described. FIG. 6 is a graph in which the dependence of thickness of oxide film on oxidation time is evaluated for various polysilicon films having different levels of phosphorus concentration when a heat treatment of 750° C. is performed in water vapor ambient. As shown in the graph, thickness of oxide film is proportional to oxidation time. Furthermore, a polysilicon film having higher phosphorus concentration has thicker oxide film for a same oxidation time.

Figure 7:
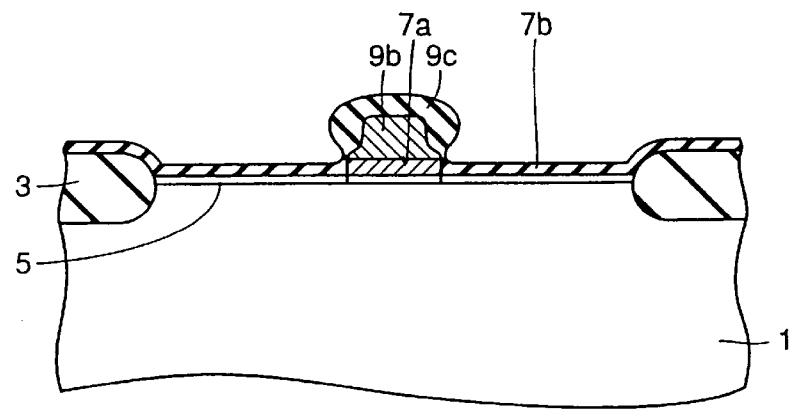
FIGS. 7, 8A and 8B are cross sectional views illustrating a series of steps performed subsequent to the step shown in FIG. 5 in the first embodiment.

In upper conductive layer 9a, the oxidation starts from the upper and both side surfaces. In the first polysilicon film, the oxidation starts from its surface. Thus, in the first polysilicon film which is not covered with the upper conductive layer, the oxidation starts from its surface and reaches gate oxide film 5, as shown in FIG. 7. A silicon oxide film 7b is thus formed. In this oxidation, the first polysilicon film is also oxidized exactly under the both side surfaces of the upper conductive layer and the oxidation proceeds inwards. The first polysilicon film covered with the upper conductive layer is not oxidized except for the portion exactly under the both side surfaces and the vicinity thereof, and remains as a polysilicon film. A lower electrode layer 7a is thus formed.

In the upper conductive layer, the oxidation starts from its upper and both side surfaces and a silicon oxide film 9c is thus formed. The polysilicon film which is not oxidized serves as an upper conductive layer 9b. Since the phosphorus concentration of the upper conductive layer is higher than that of the first polysilicon film, an oxide film formed in the upper conductive layer is larger in thickness. Consequently, the width of the upper electrode layer 9b is narrower than that of the lower electrode layer 7a when the oxide film is removed.

Referring now to FIG. 8, silicon oxide film 9c, 7b formed in the step shown in FIG. 7 is removed. A gate electrode 14 is formed which has a substantially symmetric, convex shape in lateral cross section. Then, gate electrode 14 is used as a mask and impurity ions of a predetermined conductivity are injected into semiconductor substrate 1 to form source/drain regions 13a and 13b.

Source/drain regions 13a and 13b are relatively shallow in that surfaces of the semiconductor substrate which are covered only with lower electrode layer 7a of gate electrode 14. Thus, source/drain regions 13a and 13b which have a so-called LDD structure is formed.

Source/drain regions 13a and 13b and gate electrode 14 form an MOS transistor.

Figure 8A:
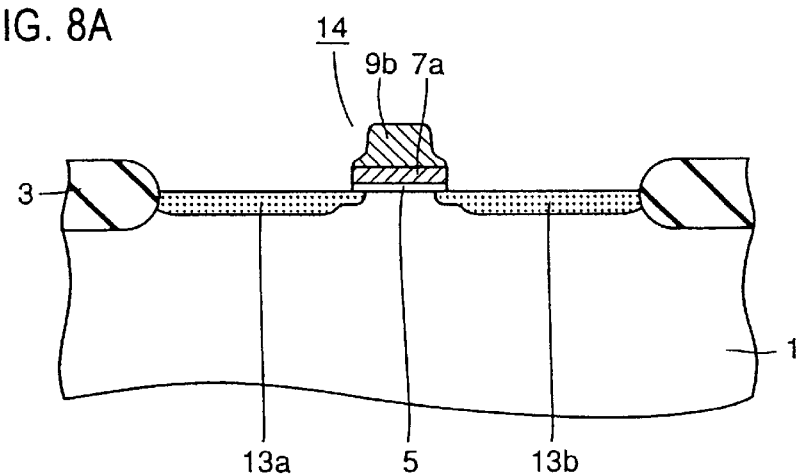

For this MOS transistor, anisotropic etching is terminated in the step shown in FIG. 4 when the first polysilicon film 7 is exposed. This suppresses damage to gate oxide film 5. This suppresses variation of the threshold voltage of the MOS transistor and reduction of the breakdown voltage of the gate oxide film and a highly reliable MOS transistor is thus obtained. Furthermore, a source/drain region having LDD structure can be formed, as shown in FIG. 8A, by performing impurity ion injection once.

Figure 9:
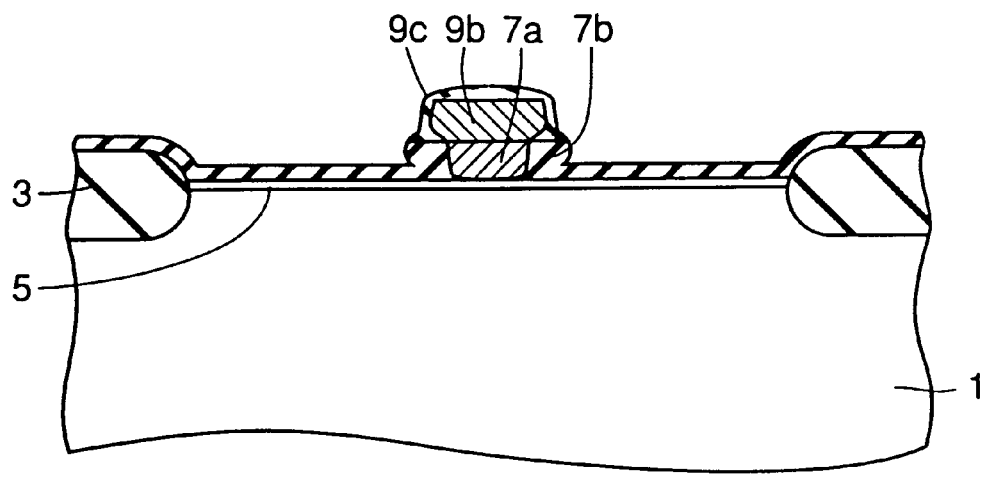
FIGS. 9 and 10 are cross sectional views illustrating another series of steps performed subsequent to the step shown in FIG. 5 in the first embodiment.

While the phosphorus concentration of the second polysilicon film is higher than that of the first polysilicon film in the aforementioned manufacturing method, the correlation in concentration may be reversed. In this example, the first polysilicon film and the upper conductive layer are oxidized in the step shown in FIG. 9 to form silicon oxide film 7b, 9c. Since the phosphorus concentration of the first polysilicon film is higher than that of the upper conductive layer, an oxide film formed in the first polysilicon film is thicker than that formed in the upper conductive layer.

Figure 10:
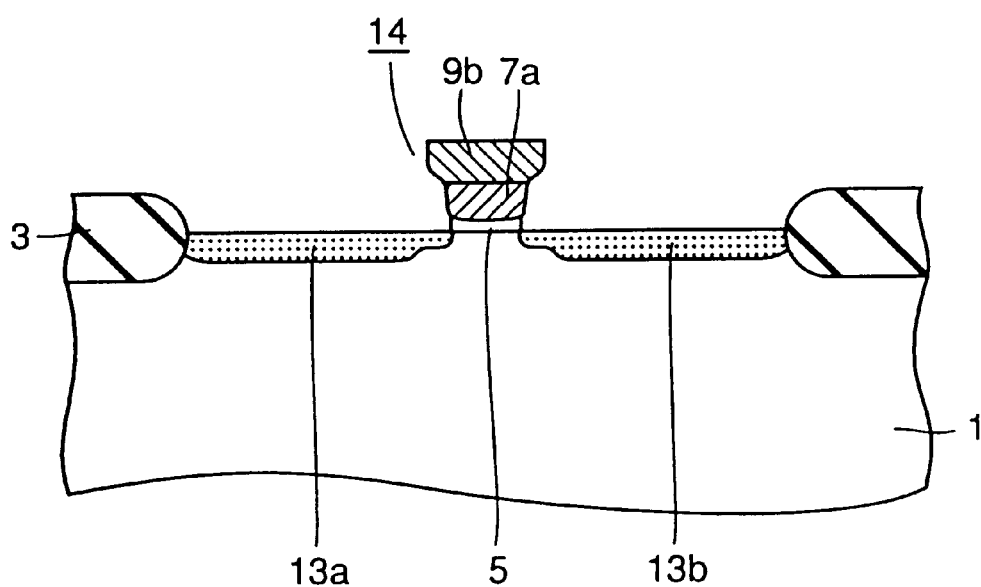

Thus, when the oxide film is removed, the width of lower electrode layer 7a is narrower than that of upper electrode layer 9b. Accordingly, gate electrode 14 having a narrower width of lower electrode layer 7a is formed in the step shown in FIG. 10. Furthermore, gate electrode 14 is used as a mask and impurity ions of a predetermined conductivity are injected into semiconductor substrate 1 to form source/ drain regions 13a and 13b. An MOS transistor is thus formed which includes source/drain regions 13a and 13b and gate electrode 14. In particular, an MOS transistor having shorter effective gate length is formed in this example.

According to the aforementioned manufacturing method, first and second polysilicon films which are different in phosphorus concentration from each other are formed as a conductive layer which serves as a gate electrode. Anisotropic etching in forming the gate electrode is terminated at the surface of the first polysilicon film. This suppresses damage from the etching particularly to the gate oxide film located immediately under a side surface of the second polysilicon film and in the vicinity thereof. Thus, variation of the threshold voltage of a completed MOS transistor and decrease of the breakdown voltage of the gate oxide film are reduced and a highly reliable MOS transistor is obtained.

Then, a predetermined heat treatment can be performed on the polysilicon films each having a different phosphorus concentration to independently control the widths of the upper and lower electrode layers which form the gate electrode. This allows control of the effective gate length of the MOS transistor. Furthermore, for a gate electrode in which the width of the upper electrode layer is narrower than that of the lower electrode layer, a source/drain region of LDD structure is formed by using the gate electrode as a mask and performing ion injection once.

While a phosphorus-doped polysilicon film is exemplified as a phosphorus-containing polysilicon film in the above embodiment, phosphorus ions may be injected after formation of a polysilicon film. Particularly in this example, a predetermined photoresist mask can be used to partially change the phosphorus concentration.

This suggests that in a semiconductor device including a CMOS transistor, for example, an n-channel MOS transistor and p-channel MOS transistor can each have a different effective gate length. Furthermore, for MOS transistors of a same channel type, effective gate length can be changed depending on the application. Furthermore, the threshold voltage and gate capacitance of an MOS transistor can be changed by changing the impurity concentration of the polysilicon film corresponding to the lower electrode layer.

While phosphorus has been exemplified as an impurity contained in the polysilicon film, arsenic or nitrogen may be contained therein. Furthermore, the first polysilicon film and the second polysilicon film may each have an impurity of a different type. For example, when the first polysilicon film is doped with nitrogen and the second polysilicon film is doped with phosphorus, the end point of etching of the second polysilicon film can be clearly indicated. More specifically, anisotropic etching of the second polysilicon film in the step shown in FIG. 4 can be readily terminated when nitrogen is detected.

As a means for clearly indicating the end point of etching of the second polysilicon film, a tunnel film may also be formed between the first and second polysilicon films. The tunnel film is desirably a thin silicon oxide film or silicon nitride film of approximately 10 Å to 20 Å. These films have etching rates smaller than that of the second polysilicon film act as an etching stopper film. Furthermore, electrical connection between the first and second polysilicon film does not deteriorate.

Figure 8B:
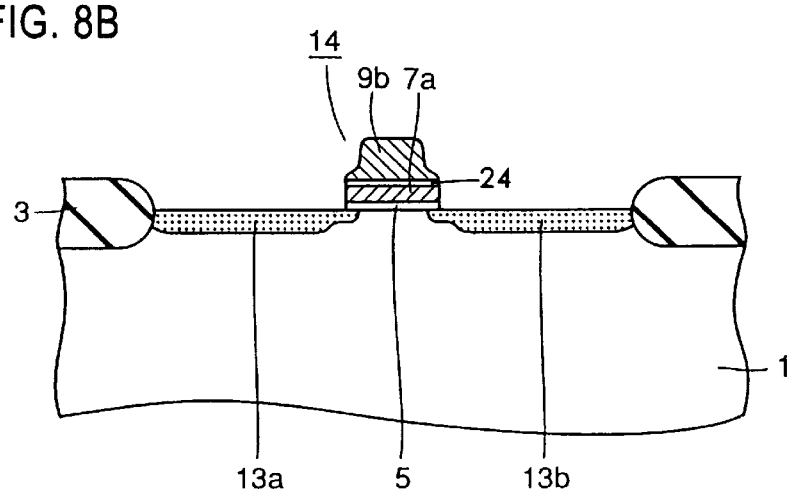

Furthermore, the formation of the tunnel film is effective at preventing the punchthrough of the impurity of the gate electrode in the ion injection with the gate electrode used as a mask to form a source/drain region. Furthermore, the grain growth of the lower electrode layer and the grain growth of the upper electrode layer are independently caused below and above the tunnel film, respectively, and thus the crystallinity of the lower electrode layer is different from that of the upper electrode layer. This can result in prevention of channeling in ion injection. FIG. 8B substantially corresponds to FIG. 8A, except that tunnel film 24 is illustrated.

While a gate electrode having a two-layer structure formed of upper and lower electrode layers has been exemplified, the width or the like of each layer can also be controlled in a structure having more than two layers.

Second Embodiment

A method of manufacturing a semiconductor device according to a second embodiment of the present invention, and a semiconductor device obtained by the manufacturing method will now be described with reference to the figures.

Figure 11:
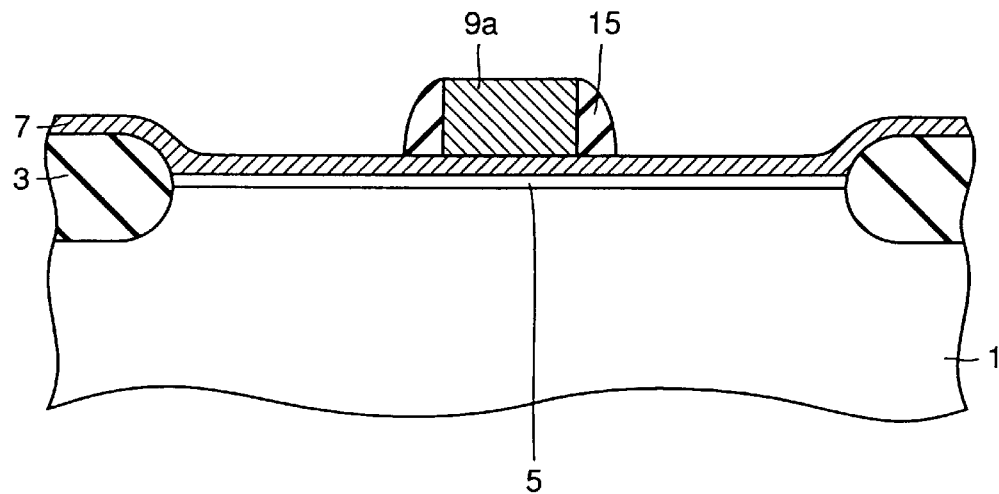
FIGS. 11–18 are cross sectional views illustrating a series of steps of a method of manufacturing a semiconductor device according to a second embodiment of the present invention.

In the step shown in FIG. 5, a silicon nitride film (not shown) is formed on the first polysilicon film to cover upper electrode layer 9a. The silicon nitride film is anisotropically etched to form a sidewall 15 on both side surfaces of upper electrode layer 9a, as shown in FIG. 11.

Figure 12:
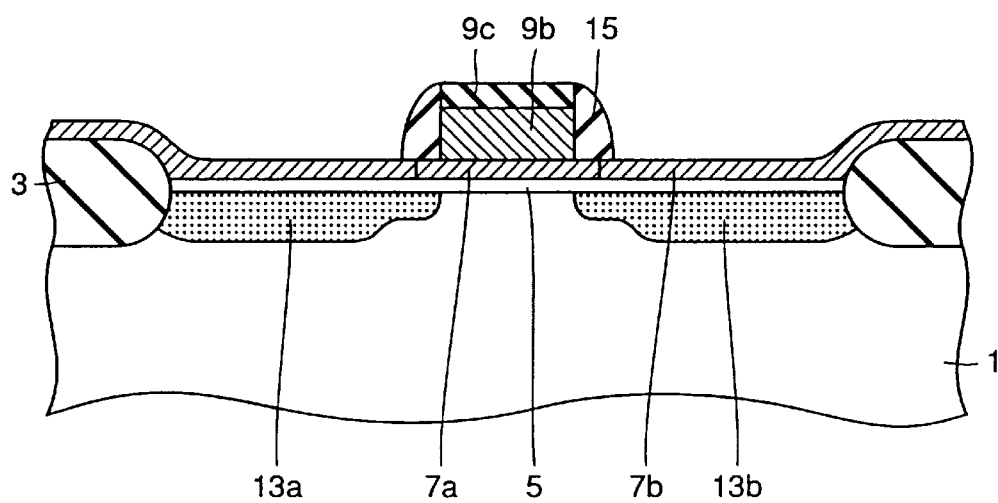

Referring then to FIG. 12, a predetermined heat treatment is performed on semiconductor substrate 1. The first polysilicon film exposed is oxidized and becomes a silicon oxide film 7b. The oxidization also reaches the first polysilicon film positioned under sidewall 15. That portion which has not been oxidized and thus remains as polysilicon film will serve as a lower electrode layer 7a. Since the upper electrode layer has sidewalls on both side surfaces, only the upper surface thereof is oxidized and a silicon oxide film 9c is thus formed. That portion which has not been oxidized and thus remains as polysilicon film will substantially serve as upper electrode layer 9b. Then, silicon oxide film 9c and sidewall 15 are used as a mask and ions of an impurity of a predetermined conductivity are injected into semiconductor substrate 1 to form a pair of source/drain regions 13a and 13b. Preferably, ion injection is performed beforehand with upper electrode layer 9a used as a mask in the step shown in FIG. 5 to obtain LDD structure.

Figure 13:
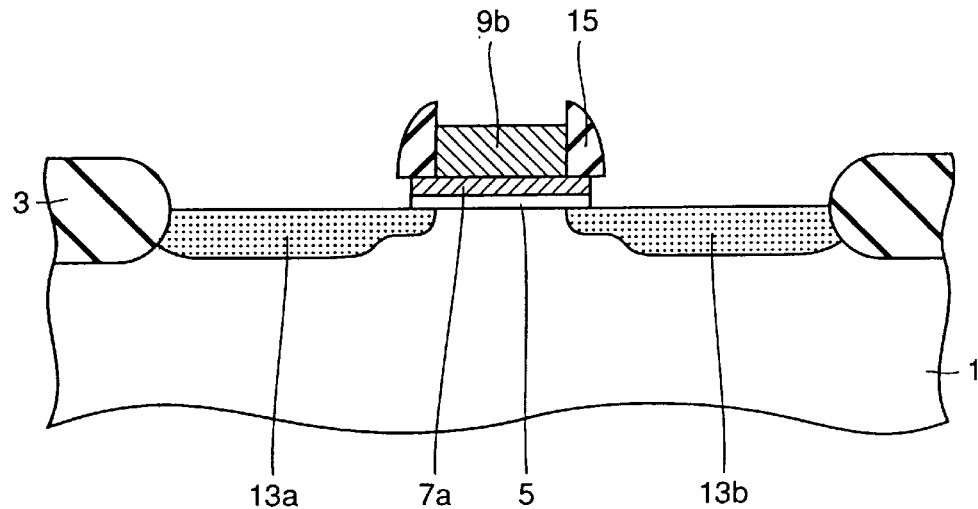

Referring then to FIG. 13, a solution of hydrofluoric acid is used to remove silicon oxide films 9c and 7b and the gate oxide film.

Figure 14:
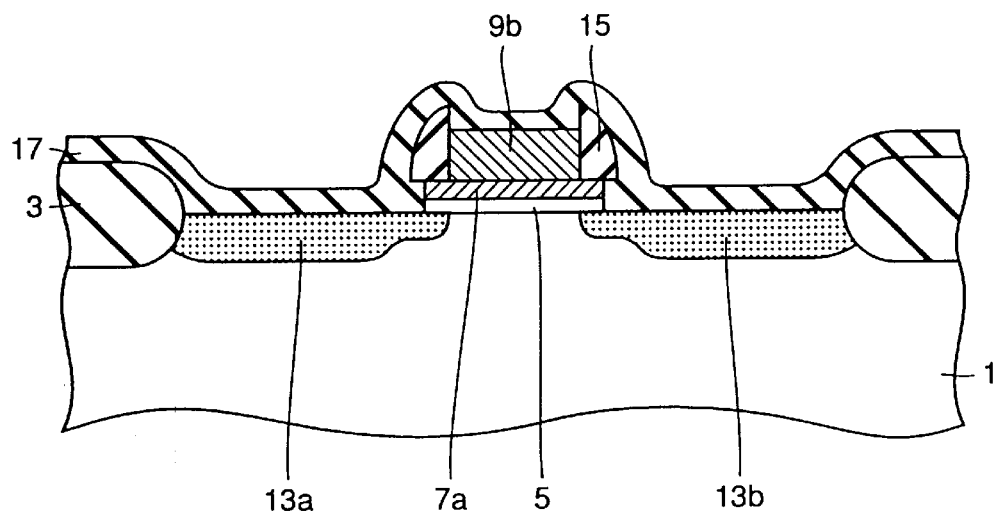

Referring then to FIG. 14, a TEOS (Tetra-Ethyl-Ortho-Silicate-Glass) oxide film 17 is formed on semiconductor substrate 1 to cover upper electrode layer 9b and sidewall 15.

Figure 15:
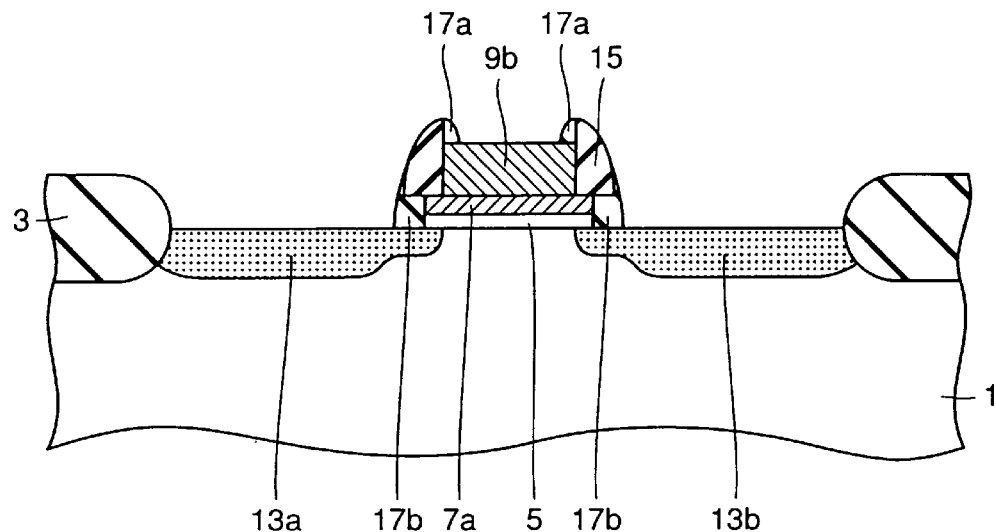

Referring then to FIG. 15, the TEOS oxide film is anisotropically etched to leave TEOS oxide films 17a and 17b. At least gate oxide film 5 and semiconductor substrate 1 immediately under a side surface of lower electrode layer 7a and in the vicinity thereof is not damaged by the anisotropic etching. Furthermore, while a cavity can be formed between TEOS oxide film 17b and lower electrode layer 7a, the formation of such a cavity is effective at reducing the capacitance between the gate and the drain of a finished MOS transistor.

Figure 16:
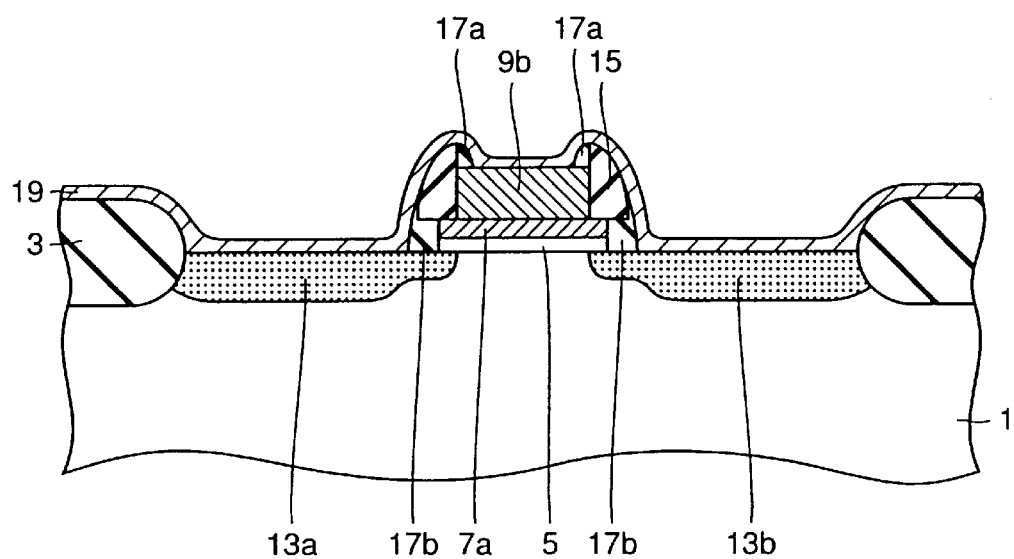

Referring now to FIG. 16, a cobalt film 19 of approximately 50 Å to 200 Å is formed on semiconductor substrate 1 by sputtering to cover upper electrode layer 9b and sidewall 15.

Figure 17:
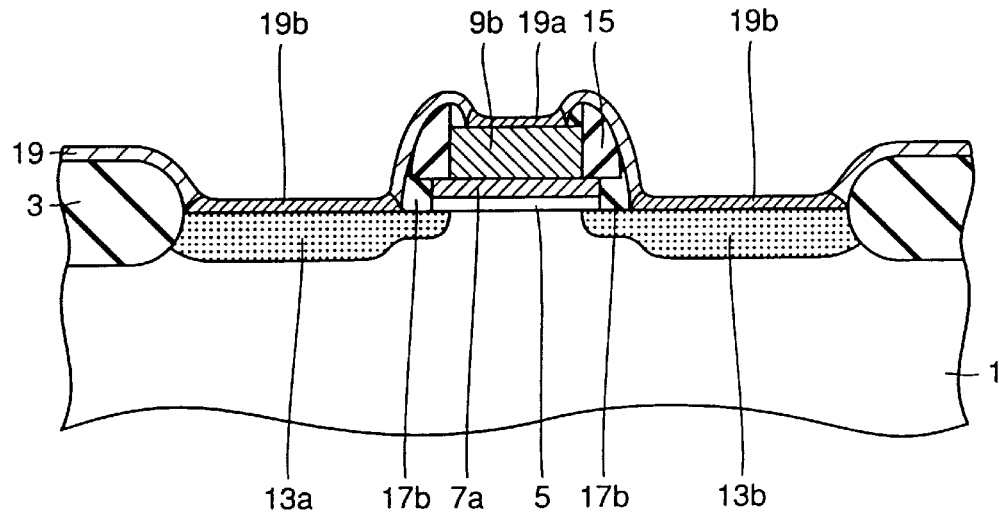

Referring then to FIG. 17, heat treatment is performed on semiconductor substrate 1 in $N_2$ ambient at a temperature of 400° C. to 600° C. for several tens seconds. Thus, cobalt film 19 reacts with the silicon in semiconductor substrate 1 and the silicon in upper electrode layer 9b to form cobalt silicide films 19a and 19b in self-alignment, respectively. Preferably, ramp annealing is used to perform the heat treatment.

Figure 18:
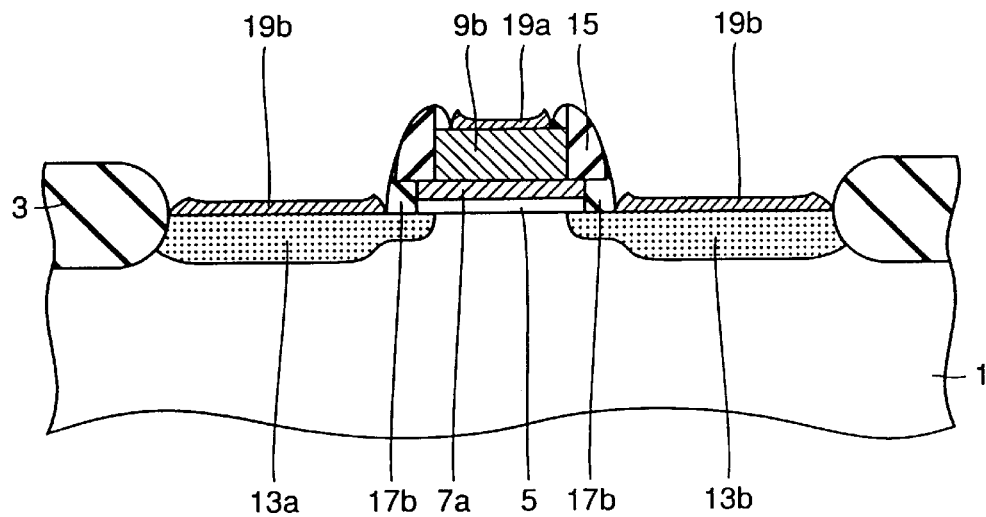

Referring then to FIG. 18, the cobalt film which has not reacted with the silicon is selectively wet-etched. Then, a further heat treatment is performed on semiconductor substrate 1 in $N_2$ ambient at a temperature of 800° C. to 900° C. for several tens seconds to achieve adequate silicidation of cobalt silicide films 19a and 19b. An MOS transistor of salicide structure is thus obtained.

In particular, according to the manufacturing method described above, the silicon oxide film formed by the oxidation of an upper surface of the upper electrode layer is removed in the step shown in FIG. 13. Thus, the level of the upper end of sidewall 15 is above that of the upper surface of upper electrode layer 9b. Sidewall 15 acts as an obstacle and the cobalt silicide film in contact with semiconductor substrate 1 and the cobalt silicide film in contact with upper electrode layer 9b are prevented from readily short-circuiting when cobalt reacts with silicon in the step shown in FIG. 17 or 18.

Furthermore, since the first polysilicon film is thermally oxidized to form lower electrode layer 7a in the step shown in FIG. 12, damage to that portion of gate oxide film 5 can be suppressed immediately under lower electrode layer 7a and in the vicinity thereof. Consequently, an effect similar to that described in the first embodiment is obtained.

Figure 19:
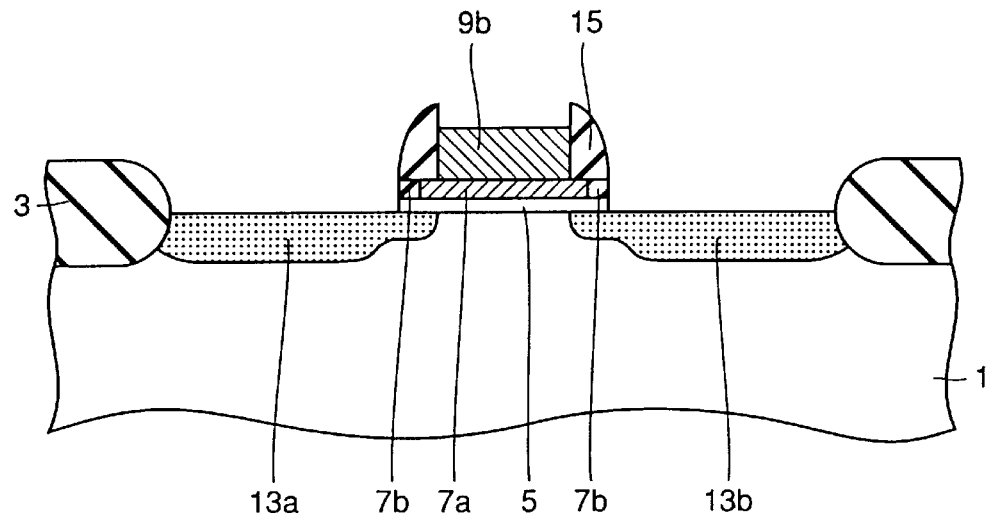
FIG. 19 is a cross sectional view illustrating a step performed subsequent to that shown in FIG. 12.

While wet-etching is used in the above embodiment in removing the formed silicon oxide films 9c and 7b and gate oxide film 5 in the step shown in FIG. 13, anisotropic etching may be used to remove these films. In this case, the silicon oxide film on upper electrode layer 9b is removed, as shown in FIG. 19. The silicon oxide film other than the portion under sidewall 15 is removed. Then, steps similar to those shown in FIGS. 16–18 are performed to obtain an MOS transistor of salicide structure.

In the manufacturing method described above, the upper surface of the upper electrode layer is oxidized and the height of the upper electrode layer can thus be reduced. Furthermore, the impurity concentration of the upper electrode layer can be changed to readily set different heights thereof. This results in the following effect.

Figure 20:
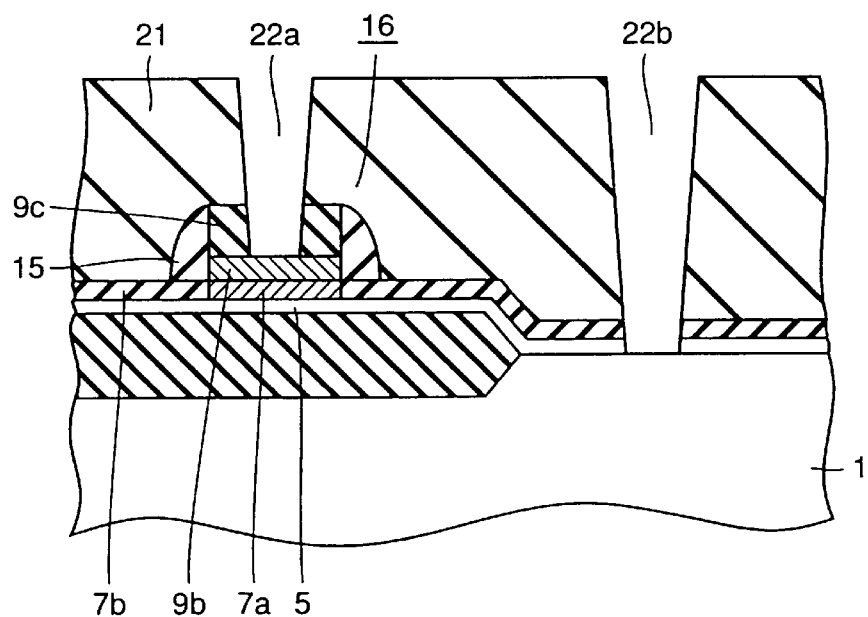
FIG. 20 is a cross sectional view of the semiconductor device according to the second embodiment.

Referring to FIG. 20, assume that a gate interconnection 16 including lower and upper electrode layers 7a and 9b is formed on an element isolating, oxide film 3. An interlayer insulating film 21 is formed to cover gate interconnection 16. A contact hole 22a which exposes a surface of upper electrode layer 9b and a contact hole 22b which exposes a surface of semiconductor substrate 1 are formed in interlayer insulating film 21. Thermal oxidation lowers the level of the upper surface of upper electrode layer 9b and the distance between the upper surface of upper electrode layer 9b and the surface of semiconductor substrate 1 is thus reduced. Thus, after upper electrode layer 9b is exposed, damage to upper electrode layer 9b from anisotropic etching is suppressed until a surface of semiconductor substrate 1 is exposed.

Third Embodiment

A method of manufacturing a semiconductor device according to a third embodiment of the present invention and a semiconductor device obtained by the manufacturing method will now be described with reference to the figures.

Figure 21:
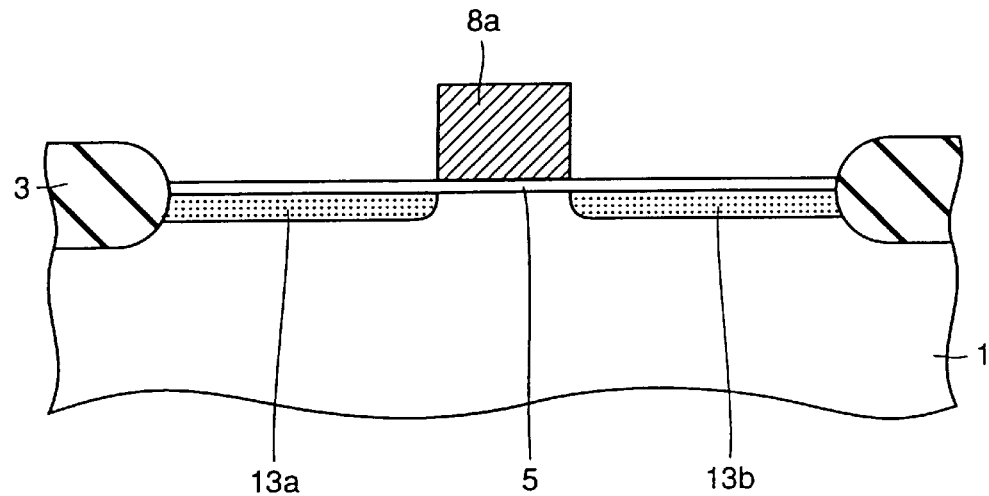
FIGS. 21–23 are cross sectional views illustrating a series of steps of a method of manufacturing a semiconductor device according to a third embodiment of the present invention.

Referring to FIG. 21, polysilicon film is formed on gate oxide film 5. A predetermined photoresist pattern (not shown) formed on the polysilicon film is used as a mask and the polysilicon film is anisotropically etched to form a conductive layer 8a. Conductive layer 8a is used as a mask and ions of an impurity of a predetermined conductivity are injected to form source/drain regions 13a and 13b.

Figure 22:
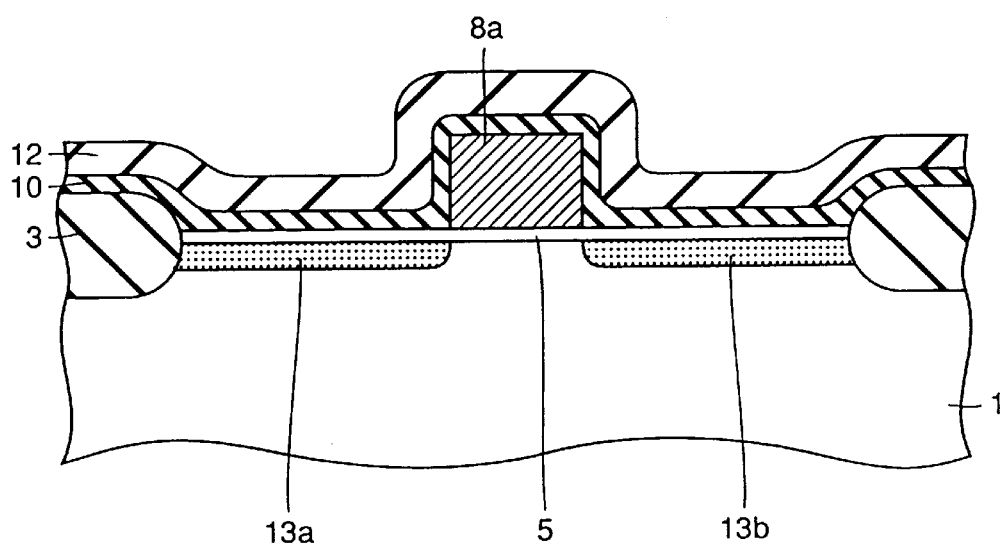

Referring then to FIG. 22, a silicon oxide film 10 of approximately 100 Å to 500 Å is formed on semiconductor substrate 1 to cover conductive layer 8a. A silicon nitride film 12 of approximately 100 Å to 500 Å is formed on silicon oxide film 10.

Figure 23:
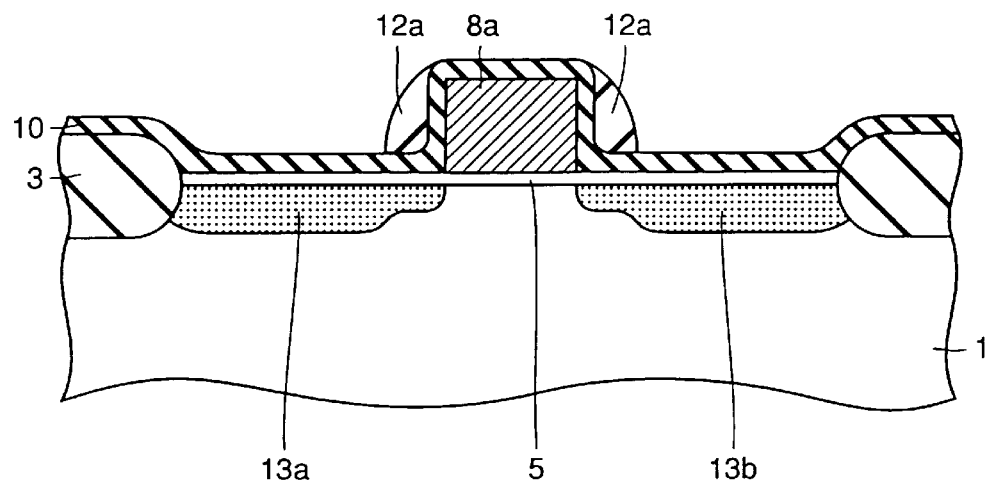

Referring then to FIG. 23, the entire surface of silicon nitride film 12 is anisotropically etched to form a sidewall 12a on that surface of silicon oxide film 10 which is in contact with both side surfaces of conductive layer 8a. Sidewall 12a and conductive layer 8a are used as a mask and ion injection is performed to form source/drain regions 13a and 13b of LDD structure. An MOS transistor is thus formed.

In this manufacturing method, gate oxide film 5 is disadvantageously damaged in forming conductive layer 8a by anisotropic etching in the step shown in FIG. 21. However, when the entire surface of a silicon nitride film is anisotropically etched in forming sidewall 12 in the step shown in FIG. 23, the silicon nitride film is etched so that silicon oxide film 10 substantially remains. Thus, damages, such as etching of a surface of semiconductor substrate 1 and crystal defects, can be reduced. Consequently, reliability of the MOS transistor is improved.

Furthermore, element isolating, oxide film 3 is not etched in anisotropically etching the entire surface, and thus the thickness of element isolating, oxide film 3 is not reduced from the initial thickness thereof. The effective thickness of the element isolating, oxide film is thus increased. Consequently, the capacitance between a conductive layer, such as an interconnection, formed on the element isolating, oxide film and the semiconductor substrate is reduced.

Although the combination of silicon oxide film and silicon nitride film is exemplified in the above embodiments, the present invention is not limited to these films as long as the upper and lower insulating films are different in etching rate from each other and ensure several selection ratios.

Fourth Embodiment

Figure 24:
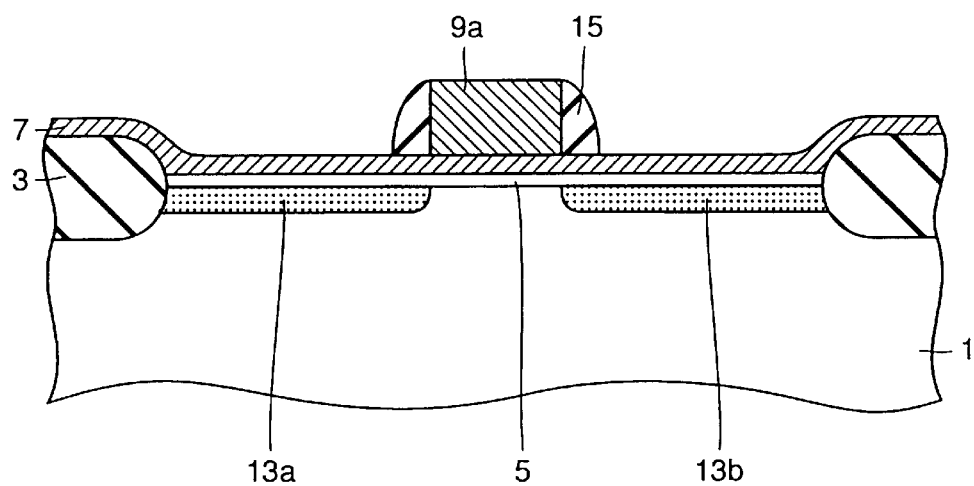
FIGS. 24 and 25 are cross sectional views illustrating a series of steps of a method of manufacturing a semiconductor device according to a fourth embodiment of the present invention.

A method of manufacturing a semiconductor device according to a fourth embodiment of the present invention will now be described with reference to the Figures. The steps are performed until the step shown in FIG. 24 is reached are similar to those performed until the step shown in FIG. 11 is reached and a detailed description thereof is not repeated.

Figure 25:
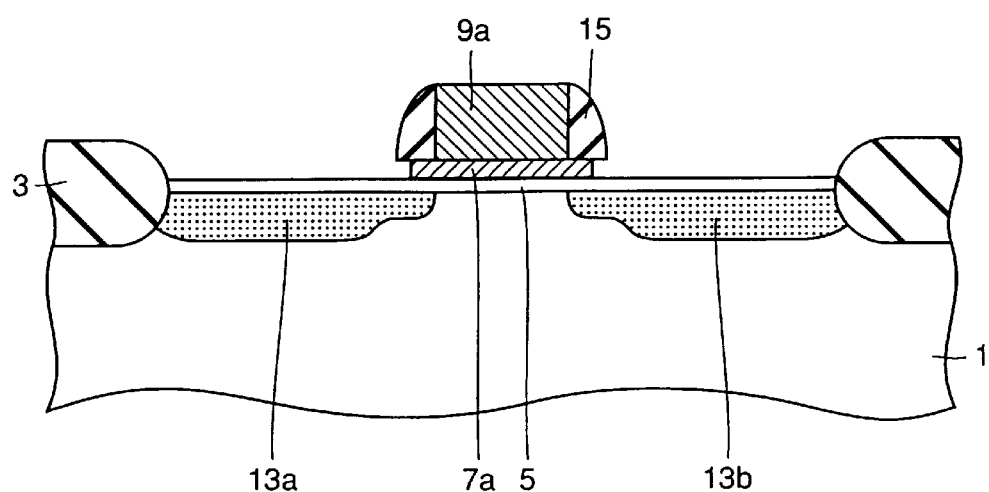
Figure 26:
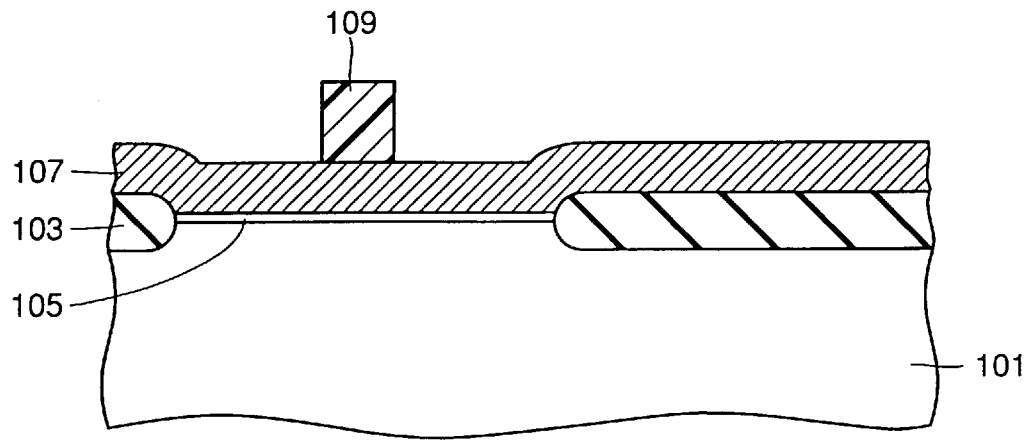
FIGS. 26–28 are cross sectional views illustrating a series of steps of a conventional method of manufacturing a semiconductor device.
Figure 27:
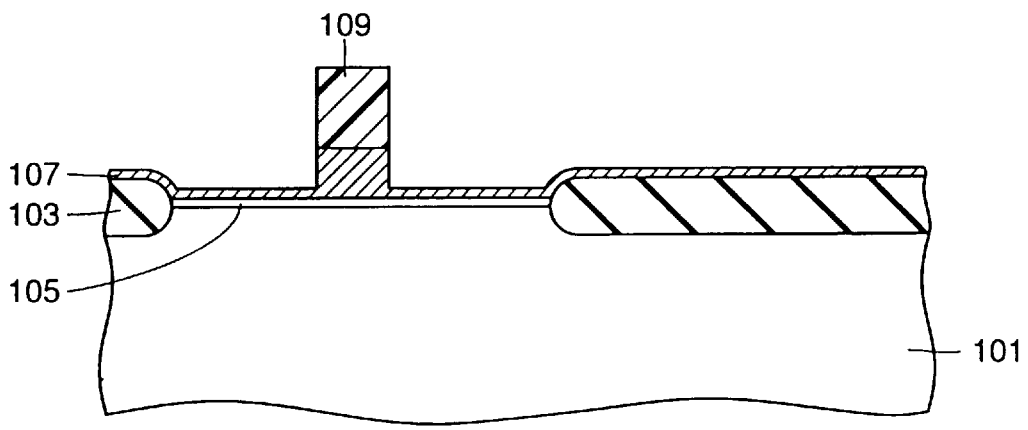
Figure 28:
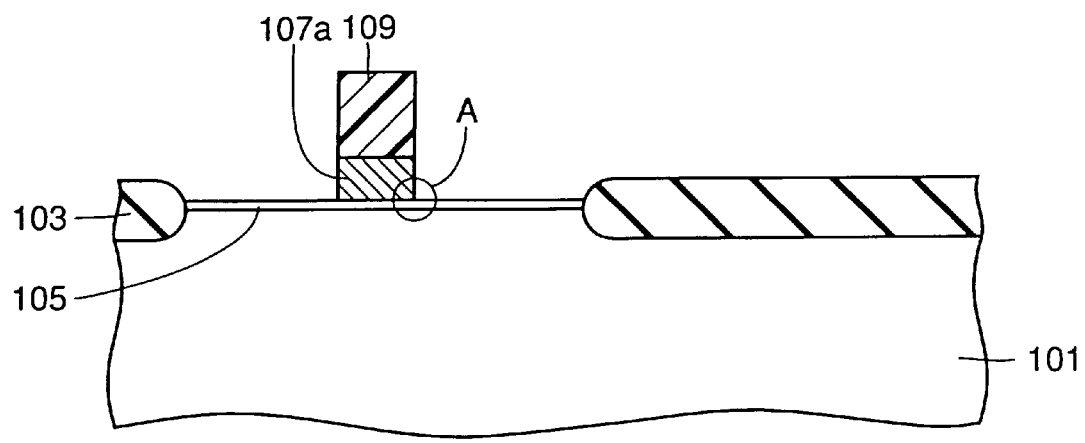
Figure 29:
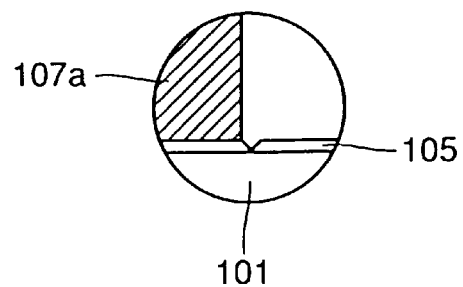
FIG. 29 is a partially enlarged view of the step shown in FIG. 28.
Figure 30:
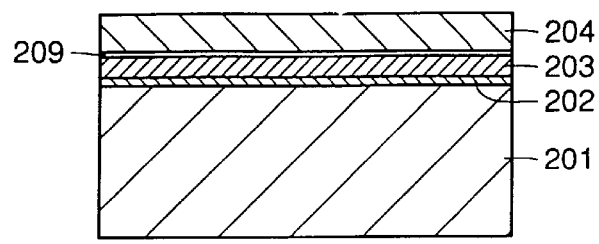
FIGS. 30–33 are cross sectional views illustrating a series of steps of the method of manufacturing a semiconductor device according to a first reference.
Figure 31:
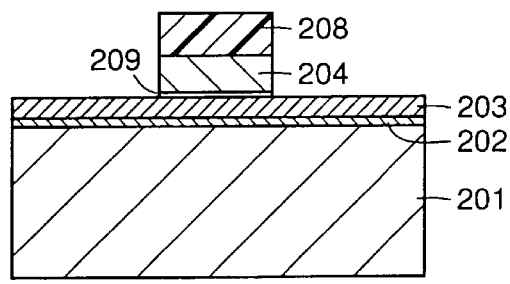
Figure 32:
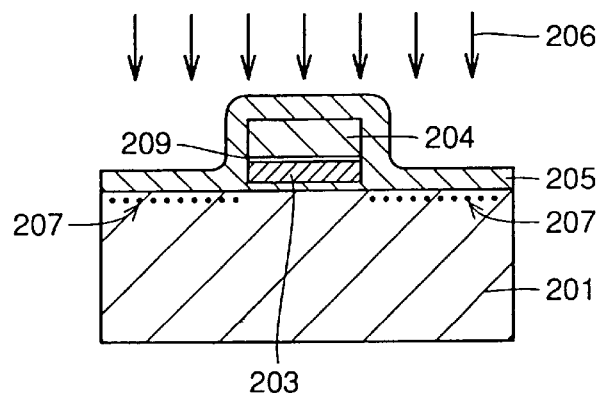
Figure 33:
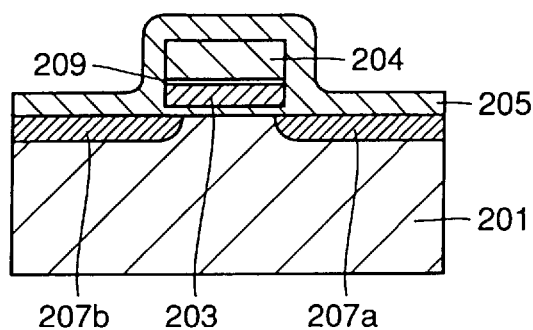
Figure 34:
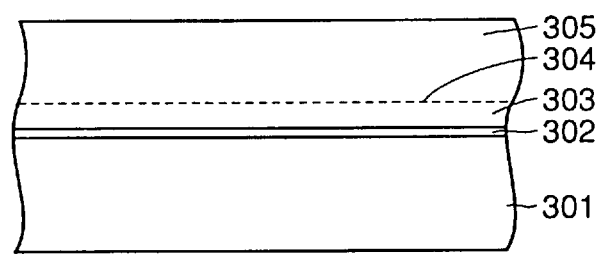
FIGS. 34–39 are cross sectional views illustrating a series, of steps of the method of manufacturing a semiconductor device according to a second reference.
Figure 35:
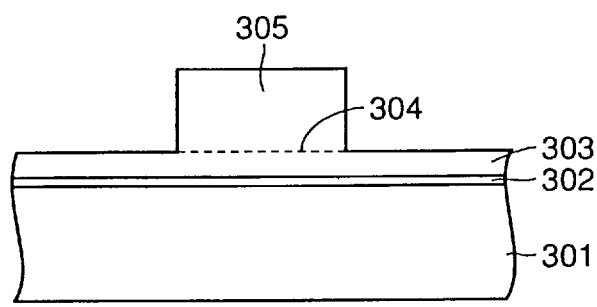
Figure 36:
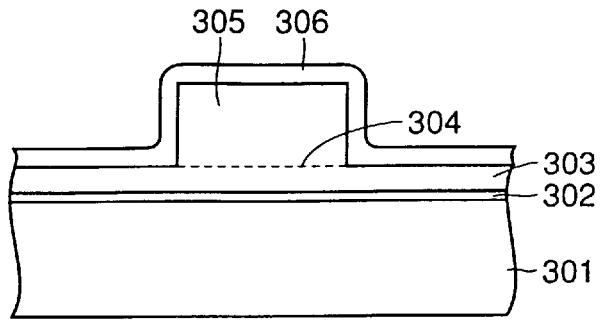
Figure 37:
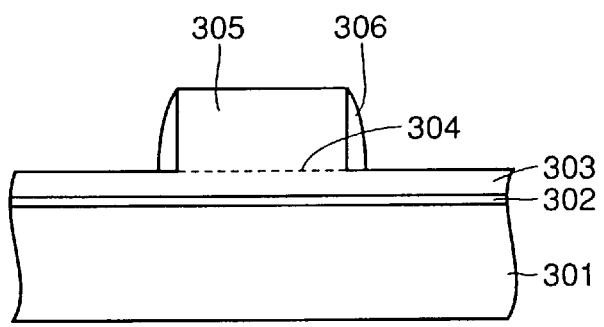
Figure 38:
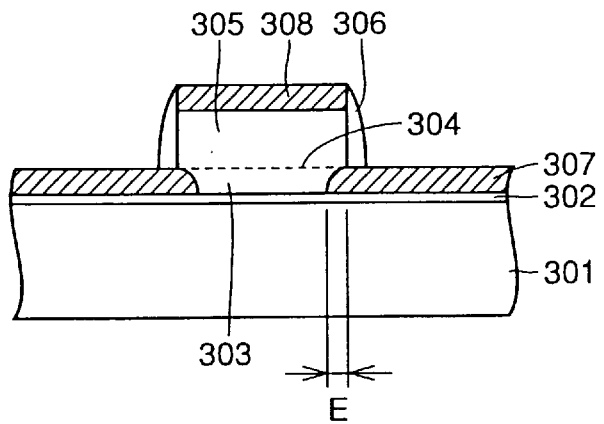
Figure 39:
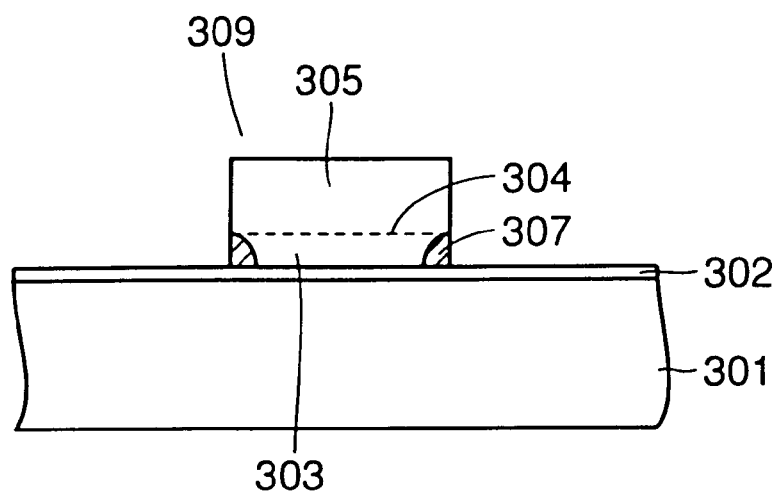

Referring to FIG. 25, isotropic etching is performed to remove the first polysilicon film. Then, sidewall 15 and upper electrode layer 9a are used as a mask and ions of an impurity of a predetermined conductivity are injected to form a pair of source/drain regions 13a and 13b. An MOS transistor is thus obtained.

Damage to gate oxide film 5 is smaller in isotropically etching the first polysilicon film according to this manufacturing method than in anisotropically etching the first polysilicon film. Furthermore, the first polysilicon film under sidewall 15 is also etched and thus the width of lower electrode layer 7a can be effectively, readily changed.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device at least comprising:
    a first conductive layer formed on a main surface of a semiconductor substrate, having a first width and containing an impurity of a first concentration; and
    a second conductive layer formed on said first conductive layer, having a second width and containing an impurity of a second concentration, said second width differing from said first width, said second concentration differing from said first concentration; wherein the semiconductor device includes a gate electrode portion having a substantially symmetrical shape in lateral cross section, the second concentration is higher than the first concentration, and the second width is smaller than the first width.

2. The semiconductor device according to claim 1, wherein:

said gate electrode portion is formed on said semiconductor substrate with a gate insulating film interposed therebetween; and a pair of source/drain regions are formed in a main surface of said semiconductor substrate with said gate electrode portion interposed therebetween.

3. The semiconductor device according to claim 2, wherein a tunnel film is interposed between said first conductive layer and said second conductive layer.

4. The semiconductor device according to claim 1, wherein a sidewall insulating film is provided in contact with at least both side surfaces of said second conductive layer, and a level of an upper end of said sidewall insulating film is above that of an upper surface of said second conductive layer.

5. The semiconductor device according to claim 4, comprising:

a pair of source/drain regions formed in a main surface of said semiconductor substrate with said gate electrode portion interposed therebetween; and a metal compound film formed on an upper surface of said second conductive layer and on a surface of said pair of source/drain regions.

6. The semiconductor device according to claim 5, wherein a tunnel film is interposed between said first conductive layer and said second conductive layer.

7. The semiconductor device according to claim 4, wherein a tunnel film is interposed between said first conductive layer and said second conductive layer.

8. The semiconductor device according to claim 1, wherein a tunnel film is interposed between said first conductive layer and said second conductive layer.

9. A semiconductor device comprising:

a gate electrode portion formed on a main surface of a semiconductor substrate; and a pair of source/drain regions formed in a main surface of said semiconductor substrate with said gate electrode portion interposed therebetween; wherein said gate electrode portion includes a conductive layer formed on said main surface of said semiconductor substrate with a gate insulating film interposed therebetween, said conductive layer having a predetermined width, a first insulating film formed on said semiconductor substrate to cover said conductive layer, and a second insulating film formed on a surface of said first insulating film in contact with both side surfaces of said conductive layer, said second insulating film being different in etching characteristics from said first insulating film wherein the first insulating layer is formed to cover the conductive layer and the semiconductor substrate, and the second insulating film is formed on each of opposite side surfaces of the conductive layer, with the first insulating film interposed therebetween.

10. A method of manufacturing a semiconductor device, comprising the steps of:

forming on a semiconductor substrate a first conductive layer having a first width and containing an impurity of a first concentration with a gate insulating film interposed therebetween;

forming on said first conductive layer a second conductive layer containing an impurity of a second concentration, said second concentration being higher than said first concentration;

using as a mask a photoresist pattern formed on said second conductive layer and anisotropically etching said second conductive layer such that the second conductive layer has a second width smaller than the first width;

performing thermal treatment to form an oxide film in a surface of said second conductive layer and in the exposed said first conductive layer; and removing said oxide film.

11. The method of manufacturing the semiconductor device according to claim 10, comprising the step of using as a mask said first and second conductive layers having said oxide film removed therefrom, and injecting impurity ions of a predetermined conductivity into a main surface of said semiconductor substrate.

12. The method of manufacturing the semiconductor device according to claim 11, comprising the step of forming a tunnel film between said step of forming said first conductive layer and said step of forming said second conductive layer.

13. The method of manufacturing the semiconductor device according to claim 11, comprising, between said step for exposing a surface of said first conductive layer and said step of forming said oxide film, the steps of:

forming an insulating film on said first conductive layer to cover said second conductive layer; and anisotropically etching said insulating film to form a sidewall insulating film on both side surfaces of said second conductive layer.

14. The method of manufacturing the semiconductor device according to claim 13, comprising, after said step of injecting impurity ions, the steps of:

forming a metal film on said semiconductor substrate to cover said second conductive layer and said sidewall insulating film;

performing heat treatment to form a metal compound layer in a metal film in contact with said semiconductor substrate or said second conductive layer; and removing said metal film other than said metal compound.

15. The method of manufacturing the semiconductor device according to claim 10, comprising the step of forming a tunnel film between said step of forming said first conductive layer and said step of forming said second conductive layer.

* * * * *